US006768350B1

(12) United States Patent
Dickey

(10) Patent No.: US 6,768,350 B1
(45) Date of Patent: Jul. 27, 2004

(54) MICROPROCESSOR BASED SOLID STATE DC POWER CONTROLLER

(75) Inventor: John A. Dickey, Scottsdale, AZ (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 10/120,091

(22) Filed: Apr. 10, 2002

(51) Int. Cl.[7] .............................................. H03K 3/00
(52) U.S. Cl. ...................................... 327/108; 327/434
(58) Field of Search ......................... 327/108–112, 170, 327/434, 436, 437; 326/82, 83

(56) References Cited

U.S. PATENT DOCUMENTS

| | | | | |
|---|---|---|---|---|
| 6,114,895 A | * | 9/2000 | Stephens | 327/391 |
| 6,130,569 A | * | 10/2000 | Aswell et al. | 327/374 |
| 6,169,431 B1 | * | 1/2001 | Xu | 327/109 |
| 6,198,315 B1 | * | 3/2001 | Nakano | 327/110 |
| 6,204,700 B1 | * | 3/2001 | Seyed | 327/108 |
| 6,229,355 B1 | * | 5/2001 | Ogasawara | 327/108 |
| 6,268,748 B1 | * | 7/2001 | Bertin et al. | 327/108 |
| 6,331,794 B1 | * | 12/2001 | Blanchard | 327/112 |
| 6,407,593 B1 | * | 6/2002 | Kawamoto et al. | 327/110 |

* cited by examiner

*Primary Examiner*—Kenneth B. Wells
(74) *Attorney, Agent, or Firm*—Carlson, Gaskey & Olds

(57) ABSTRACT

A switching system includes a microcontroller that provides a powering signal to a solid state switch, such as a field effect transistor (FET). A powering signal from the microcontroller preferably is amplified using a charge pump to triple the magnitude of the signal from the microcontroller to provide a sufficient voltage to operate the gate of the FET. The microcontroller preferably provides the powering signal at least several cycles during a selected time period on a repeated, cyclical basis. During times when the controller is not providing the powering signal to operate the gate of the FET, the controller is free to perform other functions. Various other features, including over current monitoring are disclosed.

16 Claims, 1 Drawing Sheet

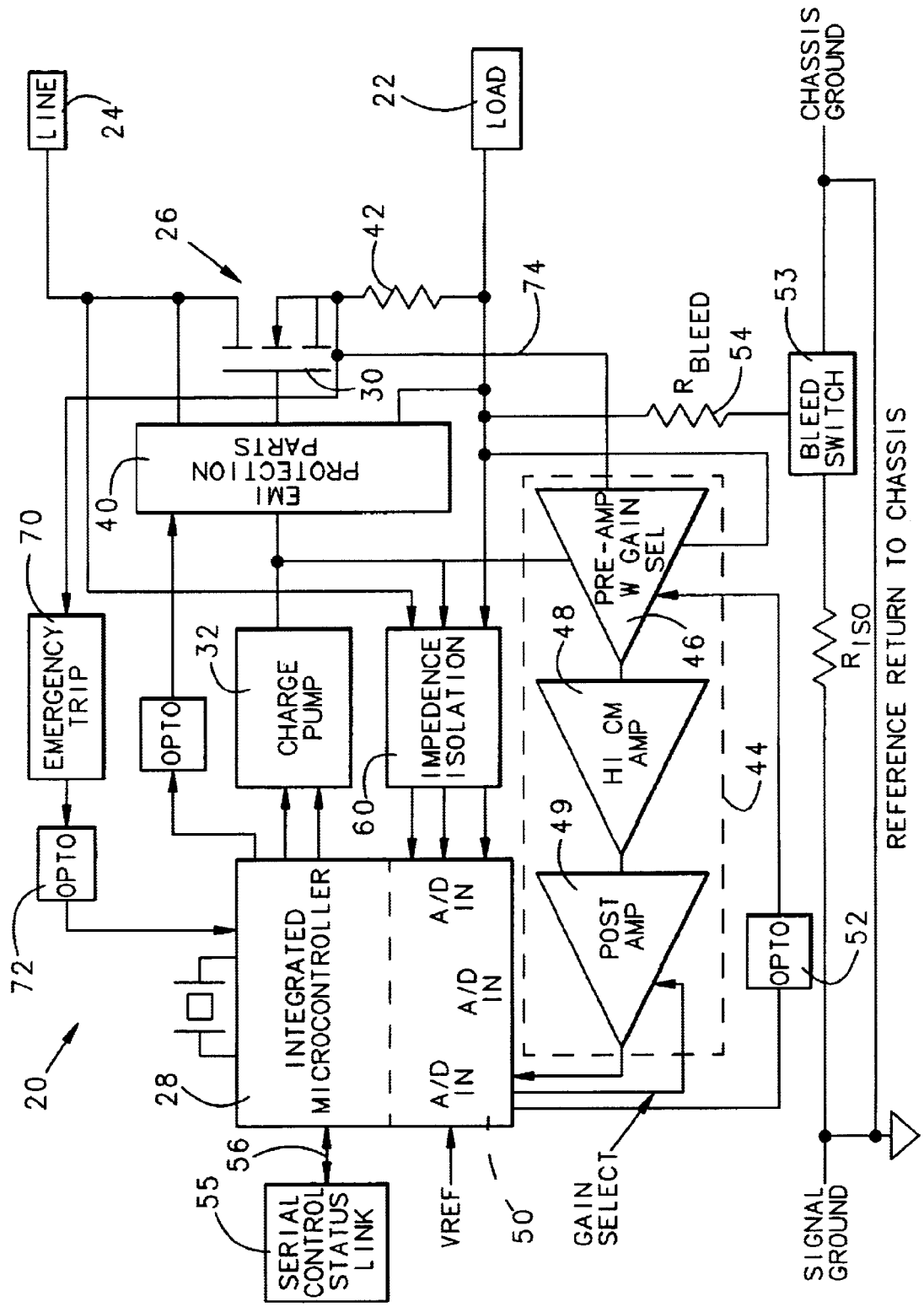

MICROPROCESSOR BASED SOLID STATE DC POWER CONTROLLER

BACKGROUND OF THE INVENTION

1. Field of the Invention

This invention generally relates to solid state DC power control. More particularly, this invention relates to a microprocessor based solid state DC power controller arrangement where a microprocessor provides a powering signal to a solid state switch to selectively couple a load to a power source.

2. Description of the Prior Art

A variety of ways have been used to couple loads to power sources. Depending upon the current levels involved and the environment in which the load must operate, the type of switching arrangement can vary widely.

In many instances, there is a need to minimize the size and weight of the control arrangement. Solid state power controllers have been used in aircraft applications, for example. Such controllers have typically been hybrid devices utilizing field effect transistors (FET) to perform the actual current switching. Typically, a switching power supply DC-DC converter is used to provide power for the FET control and monitoring circuitry. Optocouplers typically are used to send control signals to the FET. The load is monitoring typically is accomplished by using analog amplifiers and voltage-to-frequency or voltage-to-pulse width modulation conversion to communicate load current values to low voltage control logic through additional optocouplers. In some instances, analog circuitry directly performs the load current monitoring and a circuit breaker function in the event of an over current situation.

While such arrangements have performed adequately under many circumstances, those skilled in the art are always striving to make improvements. Lighter weight, less complicated circuitry and increased robustness and versatility are all desirable. This invention provides an improved, more economical, versatile and more robust arrangement compared to conventional approaches.

SUMMARY OF THE INVENTION

In general terms, this invention is a system for selectively coupling an electrically powered load with a power source.

A system designed according to this invention includes a solid state switch having a gate that is energized to switch the solid state switch into a state to conduct electrical current between the power source and the load. A controller output is coupled to the solid state switch gate to provide power to the gate. The controller selectively provides a powering signal to the solid state switch gate. The controller cyclically and repeatedly provides the powering signal a selected number of cycles within a selected time period to ensure that the switch is maintained in a closed, conducting state as needed.

A charge pump that increases the powering signal preferably is coupled between the controller output and the switch gate. The charge pump provides the ability to adequately energize the gate while only requiring a small powering signal from the controller.

In one example, during times when the controller is not providing the powering signal, the controller is performing other functions or operations. The amount of time during which the controller provides the powering signal depends upon, in part, performance characteristics of the chosen solid state switch and other circuit components.

One example includes a surge protection portion coupled between the solid state switch and the controller to prevent current flowing through the solid state switch from being received by the controller.

One example includes a current indicator that provides an indication of a current flowing through the solid state switch between the power source and the load. The controller preferably interprets information regarding the current and selectively turns off the switch in the event that the flowing current exceeds a selected threshold.

The various features and advantages of this invention will become apparent to those skilled in the art from the following detailed description of the currently preferred embodiment. The drawing that accompanies the detailed description can be briefly described as follows.

BRIEF DESCRIPTION OF THE DRAWING

The FIGURE schematically illustrates a switching system designed according to this invention where a microcontroller provides a powering signal to operate a solid state switch.

DETAILED DESCRIPTION OF THE PREFERRED EMBODIMENT

A switch system 20 for selectively coupling a load 22 to a power source 24 is schematically illustrated in FIG. 1. A solid state switch 26, which in the illustrated example is a field effect transistor (FET), is controlled to selectively allow current to flow from the power source 24 to energize the load 22.

A microcontroller 28 provides a powering signal to a gate portion 30 of the switch 26 to selectively close the switch so that the load 22 is powered as desired. The powering signal from the microcontroller 28 preferably is amplified using a charge pump 32, which operates as known in the art.

In one example, the controller 28 generates a differential square wave output. The charge pump 32 in this example preferably triples the magnitude of the powering signal provided by the controller 28 before that is supplied to the gate portion 30 of the switch 26.

The controller 28 preferably provides the powering signal over at least several cycles during a selected time period. In one example, each period lasts on the order of several microseconds. The period, number of powering cycles and the powering signal will vary depending upon circuit time constraints. While providing the powering signal, the controller effectively creates the floating gate power supply needed to turn on the FET 26. During times when the controller 28 is not providing the powering signal to the FET 26, the controller 28 is free to perform other functions and to then repeatedly and periodically return to providing the powering signal so that the switch 26 performs as desired and the load 22 receives the appropriate amount of power from the power source 24.

Given this description, those skilled in the art will be able to determine the appropriate amount of time and the signal levels required to properly control a selected switch 26 for their particular situation.

The illustrated example includes surge protection circuitry 40 that effectively isolates the controller 28 from any possibly damaging transients that would otherwise be experienced by the controller 28 because of the connection with the load 22 and power source 24 through the switch 26. The surge protection circuitry 40 may include a variety of known integrated circuit components to provide the desired amount of protection, given the expected power levels within a particular system.

A current indicator 42 preferably provides an indication of the amount of current flowing through the switch 26 to power the load 22. The current indicator in the illustrated example comprises a resistor in series with the FET 26.

The signal provided by the charge pump 32 preferably also powers an amplifier portion 44 of the system 20. The illustrated example includes a preamp 46 that amplifies the voltage drop across the current indicator 42. The signal from the preamp 46 is coupled into a high common mode rejection differential amplifier 48, the output of which is provided to another amplifier 49. The output from the amplifier portion 44 is provided to an analog-to-digital converter 50. In the illustrated example, the analog-to-digital converter 50 is a resident portion of the controller 28.

The amplifier 49 preferably has a controllable gain that is selected by an output from the controller 28. The gain of the amplifier 49 preferably is adjusted to address different scenarios during operation of the system 20. One example includes when it is necessary to provide the controller 28 with information regarding the current level supplied to the load 22.

The signal received by the converter 50 provides an indication to the controller 28 of a current level being supplied to the load 22. The controller 28 preferably is programmed to compare the current level information to preselected criteria. Whenever the current level exceeds a chosen threshold, the controller 28 preferably turns off the FET 26 to prevent an over current situation at the load 22. Given this description, those skilled in the art will be able to select appropriate criteria for when to turn off the solid state switch 26 in a particular situation when utilizing a switching system designed according to this invention.

The illustrated example includes an optocoupler 52 that is selectively energized by the controller 28 to select the gain of the preamp 46. This particular arrangement is useful in situations where the load 22 may vary or the current levels supplied to the load may need to be varied. The selectable gain of the preamp 46 allows for various over current thresholds to be tolerated depending on the needs of a particular situation.

The gain of the amplifier 49 preferably is also adjustable to address the situation where it is desirable to measure a bleed current that is added to the current monitoring path by operating a bleed switch 53. Those skilled in the art who have the benefit of this description will be able to select appropriate switching components for the bleed switch 53. The illustrated example includes a resistive element 54 associated with the bleed switch 53 to control the bleed current. In one example, the resistor associated with the bleed switch has a 1000 Ohm resistance. In one example, the bleed current effectively adds an additional 28 milliamps to the current monitoring path and the controller 28 is programmed to identify the additional bleed current to confirm accurate current monitoring within the system 20.

Accordingly, the amplifier 49 preferably provides enough gain to make the bleed current detectable. Additionally, the amplifier 49 preferably is adjustable in a manner to verify the gain of the amplifier portion 44. The inclusion of such an adjustable amplifier provides the inventive system with additional dynamic range for the current monitoring path.

The controller 28 preferably receives signals from an external device 55, such as a computer, microprocessor or another microcontroller. In one example, the device 55 is a control interface used to report status data such as current level and bit status information. The signals preferably are received over a serial interface 56. The signals supplied to the controller 28 may include information indicating a desired operation of the switch 26 and programming to be executed by the controller 28, for example.

The illustrated example controller 28 also includes the ability to determine a voltage at the power source 24, a voltage at the load 22, a reference voltage at the switch gate 30 and a separate reference voltage utilizing an analog-to-digital converter that is part of the controller 28. The illustrated example includes impedance isolation components 60 to protect the controller 28 and the analog-to-digital converter from transients that would otherwise interfere with the operation or damage the controller 28. A variety of known isolation components or techniques may be used in a system designed according to this invention.

Another feature of the illustrated example implementation of this invention is an emergency trip portion 70 that includes an optocoupler 72, which is useful for speeding up the response time in a high fault current situation. The controller operates as described above to limit the current provided to the load 22 and does so responsive to input from the emergency trip portion 70. The emergency trip portion 70 provides an additional, optional overcurrent detection feature that provides a faster response time when needed. A variety of component arrangements may be used to construct an emergency trip to meet the needs of a given situation.

The amplifier 46 of the amplifier portion 44 preferably has an input 74 coupled with an input of the emergency trip portion 70. This allows for testing the emergency trip even though the load 22 is not receiving power.

This invention provides a unique switch controlling arrangement where a microcontroller provides powering signals to a solid state switch to control a coupling between a power source and a load. The inventive arrangement provides a more versatile, robust and economical approach to solid state switching power control.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

I claim:

1. A switching system for selectively coupling a load to a power source, comprising:
   a solid state switch having a gate that is energized to switch the solid state switch into a state to conduct electrical current between the power source and the load:
   a controller that selectively provides a powering signal to the solid state switch gate, the controller cyclically and repeatedly providing the powering signal a selected number of cycles within a selected time period; and
   a current indicator that provides an indication of a current level flowing through the solid state switch and a test current portion that adds a test current to the current level flowing through the solid state switch and wherein the controller uses the combined test current and current level flowing through the solid state switch to determine whether the current indicator is operating as desired.

2. The system of claim 1, including a charge pump coupled to the solid state switch gate, the charge pump amplifying the powering signal and providing the amplified signal to power the switch gate.

3. The system of claim 1, including a surge protection portion coupled between the solid state switch and the controller that prevents current flowing through the solid state switch from being received by the controller.

4. The system of claim 1, including a current indicator that provides an indication of a current level flowing though the solid state switch and wherein the controller uses the indication to responsively turn off the solid state switch when the current level exceeds a selected threshold.

5. The system of claim 4, wherein the current indicator comprises a resistor in series with the solid state switch.

6. The system of claim 5, including an amplifier portion that amplifies a voltage drop across the resistor, the amplifier portion providing a signal to the controller that is indicative of the voltage.

7. The system of claim 6, wherein the controller includes an analog-to-digital converter that receives the amplifier portion signal and wherein the controller interprets the converted digital signal according to preselected criteria.

8. The system of claim 6, wherein the amplifier portion has a selectable gain and including an optocoupler between the controller and the amplifier portion, wherein the controller selectively energizes the optocoupler to set a gain of the amplifier portion depending on an expected current level flowing through the solid state switch to the load.

9. The system of claim 1, wherein the solid state switch comprises a FET.

10. The system of claim 1, wherein the controller performs at least one other function during at least one portion of the selected time period when the controller is not providing the powering signal to the switch.

11. The system of claim 1, including a serial interface through which the controller receives programming and signals indicative of a desired solid state switch operation and wherein the controller generates the powering signal responsive to the received signals.

12. The system of claim 11, wherein the signals include programming.

13. The system of claim 1, wherein the test current portion includes a switch that selectively couples a load to the current indicator input such that an additional current is preset at the input.

14. A method of selectively coupling an electrically powered load to a power source using a solid state switch, comprising the step of:

coupling a controller to the solid state switch;

generating a powering signal using the controller;

cyclically and repeatedly supplying the powering signal to the solid state switch at least several cycles of a selected time period:

determining a current level flowing through the switch and using the controller to turn off the switch when the determined current level exceeds a chosen threshold; and adding an additional test current to the current level and using the controller to detect the test current to determine whether current level detection electronics are operating as desired.

15. The method of claim 14, including increasing a magnitude of the powering signal and supplying the increased magnitude powering signal to the switch.

16. The method of claim 14, including choosing the selected time period based upon a performance characteristic of the switch.

\* \* \* \* \*